US012751209B2

(12) United States Patent
Nakamura

(10) Patent No.: US 12,751,209 B2
(45) Date of Patent: Sep. 29, 2026

(54) SUBSTRATE WITH A PIEZOELECTRIC FILM AND PIEZOELECTRIC ELEMENT

(71) Applicant: FUJIFILM Corporation, Tokyo (JP)

(72) Inventor: Seigo Nakamura, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 821 days.

(21) Appl. No.: 18/191,490

(22) Filed: Mar. 28, 2023

(65) Prior Publication Data

US 2023/0263066 A1 Aug. 17, 2023

Related U.S. Application Data

(63) Continuation of application No. PCT/JP2021/022400, filed on Jun. 11, 2021.

(30) Foreign Application Priority Data

Sep. 30, 2020 (JP) ................................ 2020-166405

(51) Int. Cl.
*H10N 30/853* (2023.01)
*H10N 30/87* (2023.01)

(52) U.S. Cl.
CPC ....... *H10N 30/8554* (2023.02); *H10N 30/878* (2023.02)

(58) Field of Classification Search
CPC ......................... H10N 30/8554; H10N 30/878
See application file for complete search history.

(56) References Cited

U.S. PATENT DOCUMENTS

2005/0146772 A1 7/2005 Murata et al.
2006/0046319 A1* 3/2006 Takeda ................ H10N 30/082 438/240
2008/0259133 A1* 10/2008 Hara ...................... B41J 2/1623 347/70

(Continued)

FOREIGN PATENT DOCUMENTS

EP 1 863 069 A2 12/2007
EP 1 953 839 A1 8/2008

(Continued)

OTHER PUBLICATIONS

English Translation of JP 2008210924 (Year: 2008).*

(Continued)

*Primary Examiner* — Bryan P Gordon
(74) *Attorney, Agent, or Firm* — Birch, Stewart, Kolasch & Birch, LLP

(57) ABSTRACT

There are provided a substrate with a piezoelectric film and a piezoelectric element, including on a substrate in the following order, a lower electrode layer and a piezoelectric film, in which in a case where B is denoted as a B site element in a perovskite-type structure, the piezoelectric film includes, a first region containing a perovskite-type oxide represented by General Formula (1), $Pb_{\delta}BO_3$ (1), here $1 \leq \delta \leq 1.5$, and a second region consisting of the same elements as elements in the first region and containing an oxide represented by General Formula (2), $Pb_{\alpha}BO_3$ (2), here $\delta/3 \leq \alpha < \delta$, and the second region is provided on an outermost layer of the piezoelectric film opposite to the lower electrode layer.

8 Claims, 5 Drawing Sheets

(56) References Cited

U.S. PATENT DOCUMENTS

| | | | | |
|---|---|---|---|---|
| 2019/0196064 | A1* | 6/2019 | Nakamura | B32B 15/04 |
| 2019/0235686 | A1* | 8/2019 | Maruyama | H10N 30/872 |

FOREIGN PATENT DOCUMENTS

| | | | |
|---|---|---|---|
| JP | 7-109562 | A | 4/1995 |
| JP | 2005-354026 | A | 12/2005 |
| JP | 2008-210924 | A | 9/2008 |
| JP | 2013-118286 | A | 6/2013 |
| JP | 2017-162906 | A | 9/2017 |

OTHER PUBLICATIONS

Japanese Office Action for Japanese Application No. 2022-553463, dated May 7, 2024, with an English translation.
Extended European Search Report for European Application No. 21874825.9, dated Feb. 7, 2024.
Hwang et al., "The effects of capping barrier layers on the compositional and structural variations of integrated Pb(Zr,Ti)O3 ferroelectric capacitor having the dimension 3 X 3 μm2," Journal of Materials Research, vol. 14, No. 5, 1999, pp. 2053-2060.
International Preliminary Report on Patentability, dated Apr. 13, 2023, and Written Opinion of the International Searching Authority, dated Aug. 31, 2021, for International Application No. PCT/JP2021/022400, with an English translation.
International Search Report for International Application No. PCT/JP2021/022400, dated Aug. 31, 2021, with an English translation.

* cited by examiner

COMPARATIVE EXAMPLE 1

EXAMPLE 1

EXAMPLE 2

SUBSTRATE WITH A PIEZOELECTRIC FILM AND PIEZOELECTRIC ELEMENT

CROSS-REFERENCE TO RELATED APPLICATIONS

This application is a continuation of International Application No. PCT/JP2021/022400, filed on Jun. 11, 2021, which claims priority from Japanese Patent Application No. 2020-166405, filed on Sep. 30, 2020. The entire disclosure of each of the above applications is incorporated herein by reference.

BACKGROUND

1. Technical Field

The present disclosure relates to a substrate with a piezoelectric film substrate and a piezoelectric element.

2. Related Art

As a material having excellent piezoelectricity and excellent ferroelectricity, there is known lead zirconate titanate ($Pb(Zr,Ti)O_3$, hereinafter referred to as PZT). The PZT is used in a ferroelectric random access memory (FeRAM) which is a non-volatile memory, by taking advantage of the ferroelectricity thereof. Furthermore, in recent years, a MEMS piezoelectric element including a PZT film has been put into practical use by fusing with micro electro-mechanical systems (MEMS) technology. A PZT film is applied as a piezoelectric film in a piezoelectric element having a lower electrode, a piezoelectric film, and an upper electrode on a substrate. This piezoelectric element has been developed into various devices such as a memory, an inkjet head (an actuator), a micromirror device, an angular velocity sensor, a gyro sensor, and an oscillation power generation device.

In a case where a piezoelectric element included in a PZT film is applied to a piezoelectric device, it is desirable that the dielectric breakdown voltage (hereinafter, referred to as a withstand voltage) of the PZT film is high. Simply, a voltage applied to a PZT film and a voltage displacement are proportional to each other, and thus a higher voltage can be applied by a PZT film having a higher withstand voltage, whereby a larger piezoelectric displacement can be obtained. In addition, it is preferable that the withstand voltage is high from the viewpoint of durability.

JP2017-162906A discloses that an insulating layer consisting of a material different from a piezoelectric film is provided between the piezoelectric film and an electrode in order to increase the withstand voltage. As the insulating layer, for example, silicon oxide ($SiO_2$), aluminum oxide ($Al_2O_3$), and magnesium oxide (MgO) are described.

On the other hand, it is known that lead (Pb) is easily omitted from the PZT film during film formation, and thus variations in piezoelectric characteristics due to Pb omitting easily occur. JP2013-118286A proposes, as a piezoelectric film having stable piezoelectric characteristics that Pb is not easily omitted, a piezoelectric film in which a plurality of layers of PZT films having Pb compositional ratios different from each other are alternately laminated.

SUMMARY

As proposed in JP2017-162906A, the withstand voltage can be increased by providing an insulating film between a piezoelectric film and an upper electrode. On the other hand, in a case of providing an insulating film between the piezoelectric film and the upper electrode, the piezoelectric constant is decreased. It is conceived that the decrease in the piezoelectric constant is due to a voltage drop in the insulating film. Although there is such a trade-off in providing an insulating film between a piezoelectric film and an upper electrode, the withstand voltage can be increased in a case where an insulating film is provided.

However, in order to provide an insulating film between a PZT film and an upper electrode as in JP2017-162906A, by using a material different from that of the PZT film, it is necessary to prepare, in manufacturing a piezoelectric element, a material dedicated to an insulating film separately from that for the PZT film and provide a step of forming an insulating film separately from the step of forming the PZT film. Although JP2013-118286A is a method for suppressing Pb omitting during manufacturing in order to provide a piezoelectric film having stable performance, it neither describes nor suggests a method of increasing the withstand voltage.

It is noted that such a problem is not limited to the PZT film but is a problem common in piezoelectric films containing a perovskite-type oxide in which the A site element is Pb.

The technique of the present disclosure has been made in consideration of the above circumstances, and an object of the present invention is to provide a substrate with a piezoelectric film and a piezoelectric element, which can be easily manufactured and in which the compatibility between the piezoelectric constant and the withstand voltage is achieved.

Specific means for solving the above problems include the following aspects.

<1> A substrate with a piezoelectric film, comprising, on a substrate in the following order:

a lower electrode layer; and a piezoelectric film;

in which in a case where B is denoted as a B site element in a perovskite-type structure, the piezoelectric film includes, a first region containing a perovskite-type oxide represented by General Formula (1), $$Pb_{\delta}BO_3 \tag{1}$$

$1 \leq \delta \leq 1.5$, and a second region consisting of the same elements as elements in the first region and containing an oxide represented by General Formula (2), $$Pb_{\alpha}BO_3 \tag{2}$$

$\delta/3 \leq \alpha < \delta$, and the second region is provided on an outermost layer of the piezoelectric film opposite to the lower electrode layer.

<2> The substrate with a piezoelectric film according to <1> or <2>, in which in General Formula (1), $B=(Zr_x Ti_{1-x})_{1-y}M_y$, is satisfied, where M is one or more elements selected from vanadium (V), niobium (Nb), tantalum (Ta), Sb (antimony), molybdenum (Mo), and tungsten (W).

<3> The substrate with a piezoelectric film according to <1> or <2>, in which a thickness of the second region is more than 1 nm.

<4> The substrate with a piezoelectric film according to any one of <1> to <3>, in which a thickness of the second region is 20 nm or less.

<5> The substrate with a piezoelectric film according to any one of <1> to <4>, in which in the second region, a compositional ratio α in General Formula (2) decreases monotonically from a first region side toward the outermost surface.

<6> A piezoelectric element comprising:

the substrate with a piezoelectric film according to any one of <1> to <5>; and an upper electrode layer provided on the piezoelectric film.

<7> The piezoelectric element according to <6>, in which at least a region of the upper electrode layer, the region being in contact with the piezoelectric film, is a conductive oxide.

<8> The piezoelectric element according to <7>, in which the conductive oxide is indium tin oxide (ITO), an iridium (Ir) oxide, or $SrRuO_3$ (SRO).

According to the present disclosure, it is possible to obtain a substrate with a piezoelectric film and a piezoelectric element, which can be easily manufactured and in which the compatibility between the piezoelectric constant and the withstand voltage is achieved.

DETAILED DESCRIPTION

Figure 1:
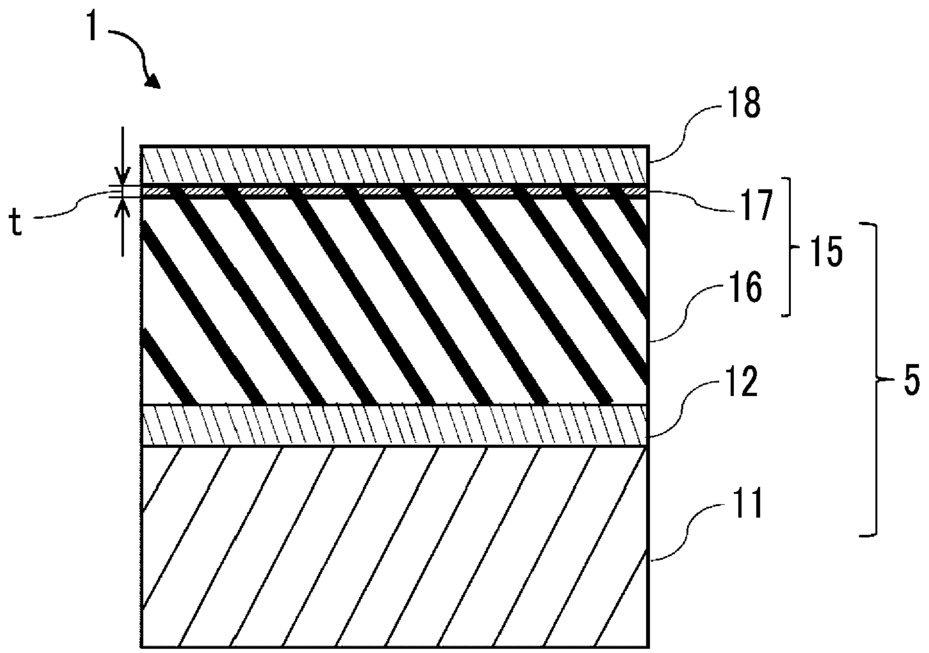
FIG. 1 is a cross-sectional view illustrating a layer configuration of a piezoelectric element according to one embodiment.

Hereinafter, embodiments according to the present invention will be described with reference to the drawings. In the drawings below, the layer thickness of each of the layers and the ratio therebetween are appropriately changed and drawn for easy visibility, and thus they do not necessarily reflect the actual layer thickness and ratio.

"Piezoelectric Element According to Embodiment"

FIG. 1 is a schematic cross-sectional view illustrating a layer configuration of a piezoelectric element 1 according to a first embodiment, which includes a substrate 5 with a piezoelectric film according to an embodiment. As illustrated in FIG. 1, the piezoelectric element 1 has the substrate with a substrate 5 with a piezoelectric film and an upper electrode layer 18. The substrate 5 with a piezoelectric film includes a lower electrode layer 12 and a piezoelectric film 15 on a substrate 11 in this order. The piezoelectric film 15 includes a first region 16 and a second region 17. The second region 17 is provided on the outermost layer of the piezoelectric film 15 on the side opposite to the lower electrode layer 12.

The first region 16 contains a perovskite-type oxide represented by General Formula (1) in a case where B is a B site element in the perovskite-type structure.

$$Pb_{\delta}BO_3 \quad (1)$$

$$1.0 \le \delta \le 1.5$$

The second region 17 contains an oxide represented by General Formula (2), which consists of the same elements as those in the first region 16.

$$Pb_{\alpha}BO_3 \quad (2)$$

$$\delta/3 \le \alpha < \delta.$$

It is noted that, in General Formula (1), although the reference ratio of the compositional ratio of the oxygen element is 3, the compositional ratio may deviate within a range in which the perovskite structure can be obtained. It suffices that the compositional ratio δ of the Pb element is $1.0 \le \delta \le 1.5$ as long as the perovskite structure can be obtained. It is preferable to be $1.0 \le \delta \le 1.2$.

It is noted that the second region 17 preferably has a perovskite structure, which may not be a perovskite structure.

The piezoelectric element 1 is configured such that an electric field is applied to the piezoelectric film 15 in the layer thickness direction, by the lower electrode layer 12 and the upper electrode layer 18.

In the above, a case of $\alpha < \delta$ means that in the piezoelectric film 15, the Pb content of the oxide of the second region 17 provided in the outermost layer on the side opposite to the lower electrode layer 12 is smaller than the Pb content of the perovskite-type oxide of the first region 16.

The second region 17 has a small Pb compositional ratio and high insulating properties as compared with the first region 16. In a case where the piezoelectric element 1 is made to function as a piezoelectric element including the second region 17, it is possible to improve the withstand voltage, as compared with a case where only the first region 16 is provided. In a case where the second region 17 has a perovskite structure in which the Pb compositional ratio is small and the A site element is Pb, the second region 17 has piezoelectricity although the piezoelectricity is inferior to that of the first region 16. Further, even in a case where $Pb_{\alpha}BO_3$ represented in General Formula (2) does not have a perovskite structure, it is conceived the piezoelectricity is exhibited, unlike an insulating film that does not exhibit piezoelectricity, such as $SiO_2$ and $Al_2O_3$. Therefore, a decrease in the piezoelectric constant can be suppressed as compared with a case where an insulating film having no piezoelectricity is provided. That is, in the piezoelectric element 1 according to the present embodiment, the compatibility between high piezoelectricity and high pressure resistance is achieved since the piezoelectric film 15 includes the first region 16 satisfying General Formula (1) and the second region 17 satisfying General Formula (2), and has such a configuration that the second region 17 is provided on the outermost layer of the piezoelectric film 15 on the side opposite to the lower electrode layer 12. In addition, due to being constituted of the same constituent elements as the constituent elements of the first region 17, it is not necessary to separately prepare a material, which makes it possible to suppress the cost.

As described above, the piezoelectric film 15 includes the first region 16 and the second region 17. The perovskite structure is generally represented by $ABO_3$, and the reference ratio of A:B:O is 1:1:3. That is, the reference value of δ is 1 in General Formula (1). However, in a perovskite-type oxide, in a case where the A site element is Pb, it is known that the Pb element is easily omitted from the A site having a perovskite structure, and thus It is generally carried out to add a larger amount of Pb, more than the stoichiometric ratio of Pb of 1. The technique of the present disclosure is particularly effective in a case where $1 \leq \delta$.

Actually, it is conceived that the excess Pb in $Pb_\delta BO_3$ of General Formula (1) or the Pb omitted from the A site is present as lead oxide (PbO) at the grain boundary between particles having a perovskite structure. Due to being an amphoteric oxide, PbO is easily ionized in a case where watery moisture invades from the outside air, and dielectric breakdown easily occurs as the amount of Pb is large. As a result, it is presumed that in a case of providing the second region 17 having a small Pb compositional ratio in a region adjacent to the upper electrode layer 18, it is possible to reduce the PbO between particles having a perovskite structure, and it is possible to improve the withstand voltage.

The element B of the B site in General Formulae (1) and (2) is not particularly limited, and it may be any element generally applicable to the B site. It is not limited to one element and may be a combination of two or more elements. Examples of the B site element include Ti, Zr, scandium (Sc), V, Nb, Ta, chromium (Cr), Mo, W, manganese (Mn), iron (Fe), ruthenium (Ru), cobalt (Co), iridium (Ir), nickel (Ni), copper (Cu), zinc (Zn), gallium (Ga), indium (In), tin (Sn), and antimony (Sb).

In particular, it is preferable to be $B=(Zr_xTi_{1-x})_{1-y}M_y$. Here, M is one or more elements selected from V, Nb, Ta, Sb, Mo, and W. That is, M may be V alone or a single element such as Nb or may be a combination of two or three or more elements, such as a mixture of V and Nb or a mixture of V, Nb, and Ta. In a case where M is these elements, a very high piezoelectric constant can be realized in combination with Pb of the A site element.

The thickness of the first region 16 of the piezoelectric film 15 is not particularly limited. In general, it is 200 nm or more and, for example, 0.2 μm to 5 μm; however, it is preferably 1 μm or more.

The thickness of the second region 17 of the piezoelectric film 15 is preferably more than 1 nm, and it is more preferably more than 1 nm and 20 nm or less. In a case of setting the thickness to more than 1 nm, it is possible to effectively prevent the generation of the leakage current, thereby capable of obtaining a good withstand voltage. In addition, in a case of setting the thickness to 20 nm or less, it is possible to obtain a good piezoelectric constant. It is noted that the thickness of the second region 17 is preferably 0.5% or less of the thickness of the first region 16. It is noted that the presence or absence of the second region 17 in the piezoelectric film 15, the thickness of the second region 17, the Pb compositional ratio of the second region 17, and the Pb compositional ratio of the first region 16 shall be determined with a transmission electron microscope (TEM) and an energy dispersive x-ray spectroscopy (EDS) analysis.

In general, in a case where layers having compositions different from each other are disposed to be adjacent, an interface region of about 1 nm, in which the composition gradually changes in the thickness direction, is naturally formed at the interface between the layers. In a naturally formed interface region, for example, in a case where the upper electrode layer and $Pb_\delta BO_3$ which is a perovskite-type oxide, are adjacent to each other, the compositional ratio between the Pb and the B site element remains constant at the interface while the respective contents of the Pb and the B site element themselves change. Therefore, δ, which is the Pb compositional ratio, does not change. Therefore, in a case of measuring the changes in the Pb site element and the B site element in the thickness direction of the piezoelectric film by EDS analysis, it is possible to determine the presence or absence of the second region according to whether or not there is a region in which the Pb compositional ratio is smaller than that of the first region 16.

In the second region 17, the compositional ratio α of Pb in General Formula (2) may decrease monotonically from the first region 16 side toward the outermost surface. For example, α may be changed so that the second region 17 has a composition closest to the Pb compositional ratio δ of the first region 16 at the boundary with the first region 16, and the Pb compositional ratio gradually decreases toward the outermost surface (the upper electrode layer 18) and the Pb compositional ratio is minimized at the interface with the upper electrode layer 18 (see FIG. 5 below).

In a case where the compositional ratio changes in the film thickness direction in the second region 17, it is preferable that the compositional ratio α satisfies $\alpha < \delta$ over the entire region of the second region 17.

It is noted that in the present specification, $\delta/3 \leq \alpha < \delta$ in General Formula (2) of the second region 17 means that the compositional ratio of the second region 17 as a whole satisfies $\delta/3 \leq \alpha < \delta$.

The second region 17 can be formed, for example, by any one of the following three methods.

The first method is a method of forming a piezoelectric film having the composition of the first region 16 and carrying out reverse sputtering. That is, particles are allowed to collide with a surface of a previously formed piezoelectric film by sputtering to cause Pb to come out, whereby Pb of the surface layer of the piezoelectric film having the composition of the first region 16 is reduced to form the second region 17. Since Pb omitting easily occurs, Pb can selectively cause to come out by selecting the sputtering conditions. According to this method, it is possible to form the second region 17 in which the Pb compositional ratio α gradually decreases from the first region 16 side toward the outermost surface.

The second method is a method of controlling a substrate temperature at the time of carrying out sputter film formation for a piezoelectric film. Since Pb is highly volatile, the composition of Pb tends to decrease in high-temperature film formation. Therefore, in a case of using the same target and setting the film formation temperature to be higher than the film formation temperature at which the first region 16 is formed, it is possible to form the second region having a Pb compositional ratio smaller than the Pb compositional ratio of the first region 16 17.

The third method is a method using targets having Pb compositional ratios different from each other. A target having a Pb compositional ratio smaller than that of a target for forming the first region 16 is used to form the second region 17. According to this method, it is possible to form the second region 17 in which the Pb compositional ratio α is substantially uniform in the thickness direction.

In any of the first to third methods, the second region 17 having a Pb compositional ratio smaller than that of the first region 16 can be formed.

Each layer of the piezoelectric element 1 other than the piezoelectric film 1 will be described.

The substrate 11 is not particularly limited, and examples thereof include substrates such as silicon, glass, stainless steel, yttrium-stabilized zirconia, alumina, sapphire, and silicon carbide. As the substrate 11, a laminated substrate having a $SiO_2$ oxide film formed on the surface of the silicon substrate may be used.

The lower electrode layer 12 is an electrode for applying a voltage to the piezoelectric film 15. The main component of the lower electrode layer 12 is not particularly limited, and examples thereof include metals such as gold (Au), platinum (Pt), iridium (Ir), ruthenium (Ru), titanium (Ti), molybdenum (Mo), tantalum (Ta), aluminum (Al), copper (Cu), and silver (Ag), and metal oxides, as well as combinations thereof. In addition, indium tin oxide (ITO), $LaNiO_3$, $SrRuO_3$ (SRO), or the like may be used. Various intimate attachment layers or seed layers may be included between the piezoelectric film 15 and the lower electrode layer 12 and between the lower electrode layer 12 and the substrate 11.

The upper electrode layer 18 is paired with the lower electrode layer 12 and is an electrode for applying a voltage to the piezoelectric film 15. The main component of the upper electrode layer 18 is not particularly limited, and examples thereof include, in addition to the materials exemplified in the lower electrode layer 12, electrode materials that are generally used in a semiconductor process such as chromium (Cr) and a combination thereof. However, it is preferable to use an oxide conductor in a region in contact with the piezoelectric film 15. Specific examples thereof include $LaNiO_3$ and ZnO which has undergone doping, in addition to ITO, an iridium oxide, and SRO. In a case of providing an oxide conductor in a region of the upper electrode layer 18, the region being in contact with the piezoelectric film 15, oxygen elements are less likely to come out from the piezoelectric film 15 as compared with a case where a metal is in direct contact with the piezoelectric film 15, and thus an effect of suppressing decreases in piezoelectricity can be obtained.

Here, "lower" and "upper" do not respectively mean top and bottom in the vertical direction. As result, an electrode disposed on the side of the substrate with the piezoelectric film being interposed is merely referred to as the lower electrode, and an electrode disposed on the side of the piezoelectric film opposite to the substrate is merely referred to as the upper electrode.

The layer thicknesses of the lower electrode layer 12 and the upper electrode layer 18 are not particularly limited, and they are preferably about 50 nm to 300 nm and more preferably 100 nm to 300 nm.

EXAMPLES

Hereinafter, Examples and Comparative Examples of the present disclosure will be described.

Figure 2:
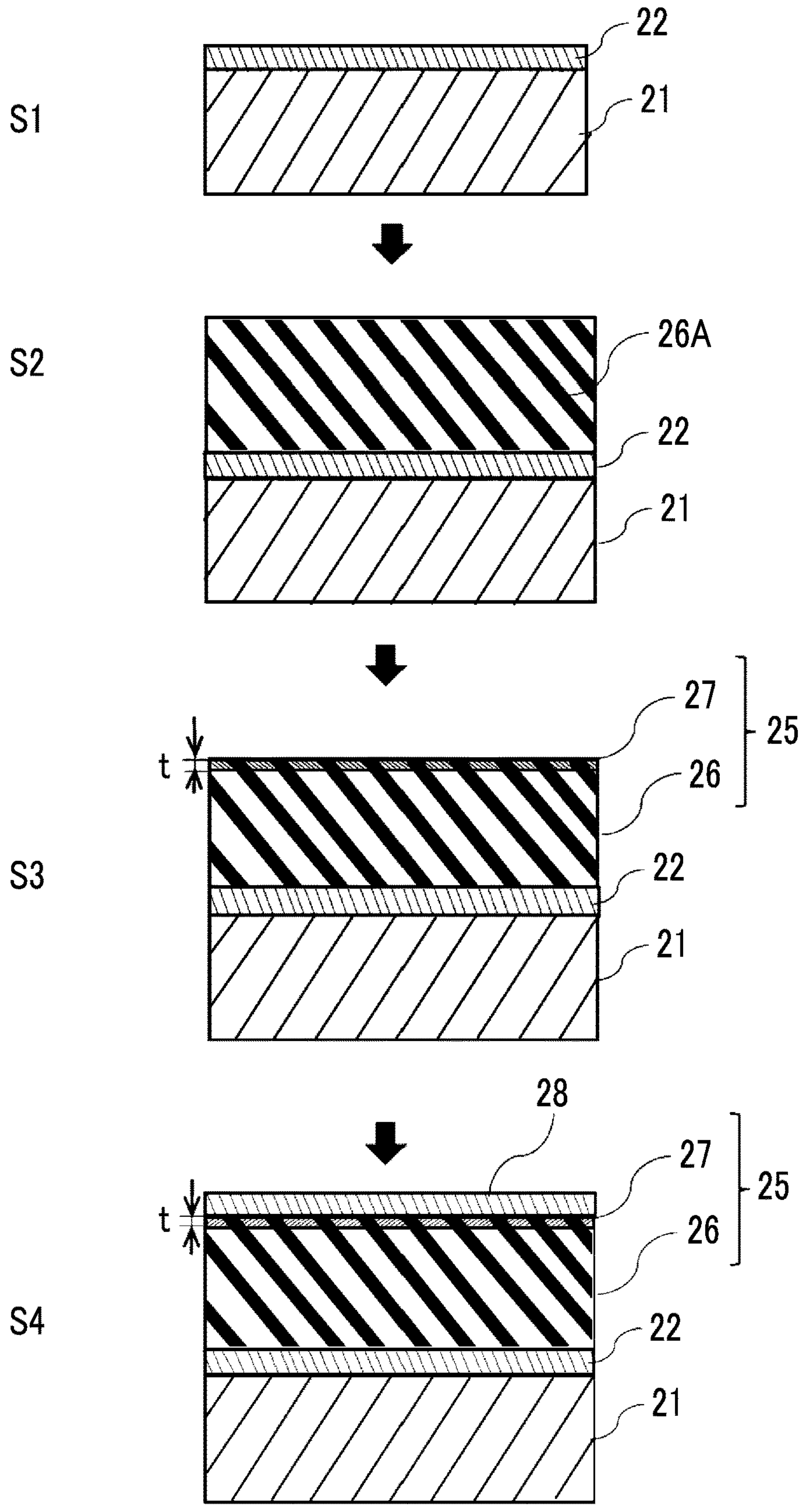
FIG. 2 is a view illustrating a manufacturing process of the piezoelectric element.

First, a method of manufacturing piezoelectric elements of Examples and Comparative Examples will be described. FIG. 2 illustrates a manufacturing process.

<Forming Step S1 of Lower Electrode Layer 22>

First, in a step S1 of a lower electrode layer 22, a Ti layer having a thickness of 20 nm and an Ir layer having a thickness of 150 nm were sequentially laminated on a Si wafer substrate 21 to produce a lower electrode layer 22.

<Forming Steps S2 and S3 of Piezoelectric Film 25>

An Nb-doped PZT film 26A having the composition of the first region was formed by sputtering. Here, a $Pb_{1.1}(Zr_{0.46}Ti_{0.42}Nb_{0.12})$ film was formed as the Nb-doped PZT film 26A. That is, 6 was set to 1.1. The Si wafer substrate 21 including the lower electrode layer 22 was placed in a radio-frequency (RF) sputtering apparatus, and the Nb-doped PZT film 26A having a thickness of 2.0 μm was formed under the conditions of a vacuum degree of 0.3 Pa and an $Ar/O_2$ mixed atmosphere ($O_2$ volume fraction: 2.0%).

Subsequently, reverse sputtering was carried out with an $Ar/O_2$ gas to form a second region 27 having a small Pb composition on the surface of the Nb-doped PZT film 26A. That is, Pb of the surface layer of the previously formed Nb-doped PZT film 26A was released to change the composition of the surface layer, and the second region 27 consisting of $Pb_{\alpha}(Zr_{0.46}Ti_{0.42}Nb_{0.12})$ satisfying $\alpha<\delta$ was formed on the surface layer. As a result, the Nb-doped PZT film 26A became a piezoelectric film 25 consisting of a first region 26 and the second region 27. In the Nb-doped PZT film 26A, a region excluding the surface layer changed to the second region 27 is the first region 26. The composition, thickness, or the like of the second region 27 can be controlled by changing the conditions of the reverse sputtering. The composition or the thickness of the second region 27 can be controlled by changing the sputtering power, the pressure, or the like. However, in this example, the thickness t of the second region 27 was controlled by the reverse sputtering time. It is noted that in Comparative Example 1, reverse sputtering was not carried out. That is, in Comparative Example 1, the second region was not formed. In addition, in Comparative Example 2, an $Al_2O_3$ film having a thickness of 5 nm was formed on the surface of the Nb-doped PZT film 26A without forming the second region.

For the reverse sputtering, an inductively coupled plasma (ICP) etcher manufactured by ULVAC, Inc. was used. The sputter gas was set to $Ar/O_2$=10 sccm/10 sccm, plasma was generated at an input power of 500 W, and then a bias voltage of 25 V was applied to the substrate to intake ions into the substrate, whereby reverse sputtering was carried out. The sputtering time was changed in a range of 120 seconds or less to control the thickness of the second region 27. The thickness of the second region 27 in each example is shown in Table 1 below. It is noted that although the thickness of the first region 26 is a value obtained by subtracting the thickness of the second region 27 from the Nb-doped PZT film 2 μm, the thickness of the first region 26 is substantially the same as the thickness of the Nb-doped PZT film 26A since the thickness of the second region 27 is sufficiently thin. In this way, the piezoelectric film 25 including the first region 26 and the second region 27 was formed.

<Forming step S4 of upper electrode layer 28>

An upper electrode layer 28 was formed by sputtering on the surface of the piezoelectric film 25, that is, the surface of the second region 27. The upper electrode layer 28 was ITO in Comparative Examples 1 and 2 and Examples 1 to 6, IrO in Example 7, SRO in Example 8, Ti/Au (here, Ti is on the PZT film side) in Example 9, and ITO/Ti/Au (here, ITO is on the PZT film side) in Examples 10. The upper electrode layer 28 was set to 100 nm.

A laminate of each example was prepared as described above, a piezoelectric element was produced according to a procedure described below, and these were evaluated as Examples and Comparative Examples.

<Measurement of Film Thickness of Second Region 27>

Figure 3:
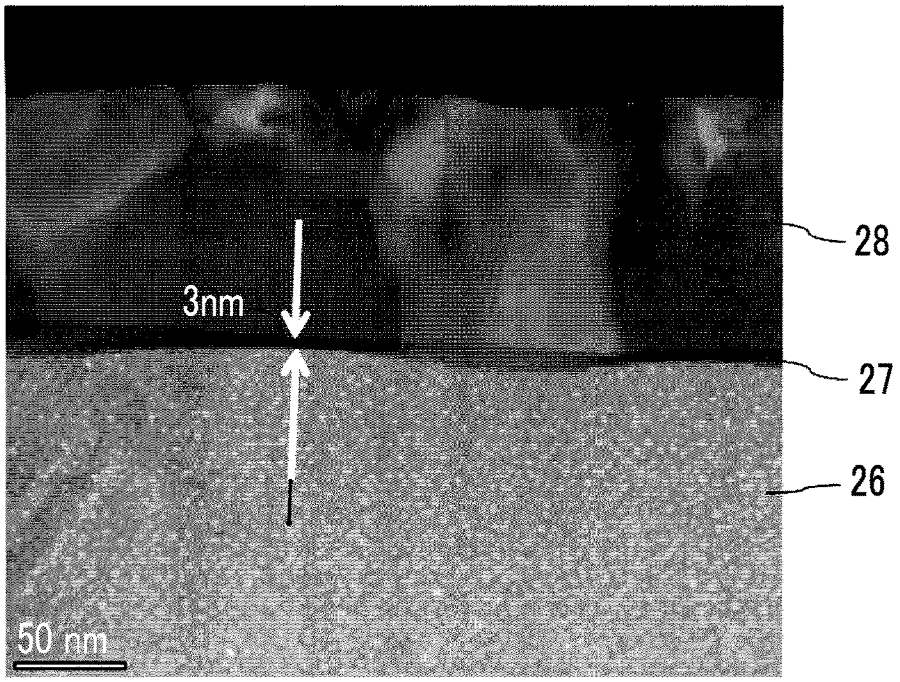
FIG. 3 is a TEM image showing a part of a laminate of Example 2.

The thickness t of the second region 27 was determined from a TEM image. Since the contrast in the TEM image differs between the first region 26 and the second region 27, the thickness of the first region 27 can be measured. FIG. 3 shows a TEM image of the vicinity of the boundary between the first region 26 and the second region 27 for Example 2. It is noted that although the thickness varies depending on the location due to the PZT surface unevenness, the minimum film thickness is defined here as the thickness t of the second region 27.

The EDS analysis was carried out at the same time as the TEM observation to confirm that the Pb composition is mainly decreased in the second region 27. As examples, the results of composition analysis by EDS in the film thickness direction of the PZT film are shown in FIG. 4 to FIG. 7 for Comparative Example 1, Example 1, Example 2, and Example 6, respectively. Here, since it is difficult to calculate the compositional ratio from TEM-EDS, the atomic fraction on the vertical axis in FIG. 4 to FIG. 7 is a reference value.

Figure 4:
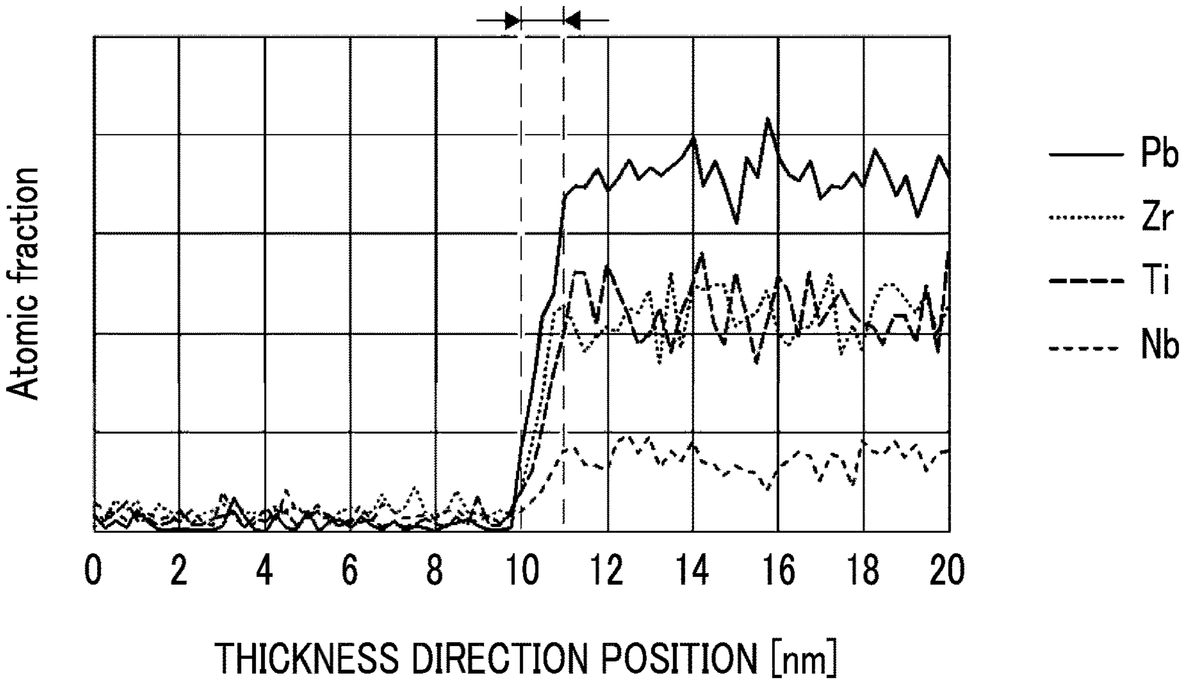
FIG. 4 is a graph showing an element content in the thickness direction of a laminate of Comparative Example 1 by EDS measurement.

Comparative Example 1 shown in FIG. 4 is an example in which the second region 27 is not provided. In FIG. 4, a position on the lateral axis at substantially 10 nm is the outermost surface of the piezoelectric film 25, that is, an interface with the upper electrode layer 28. It is noted that the amount of Pb changes linearly in a region of substantially 1 nm sandwiched between the two broken lines. In addition, the amounts of Zr, Ti, and Nb, which are B site elements, also change linearly in this region. The region, in which the amount of Pb linearly changes in this way from the composition in the upper electrode layer to the composition of the piezoelectric film while maintaining the same ratio between Pb, Zr, Ti, and Nb in the piezoelectric film 25, is an interface region that is naturally formed between two adjacent layers.

Figure 5:
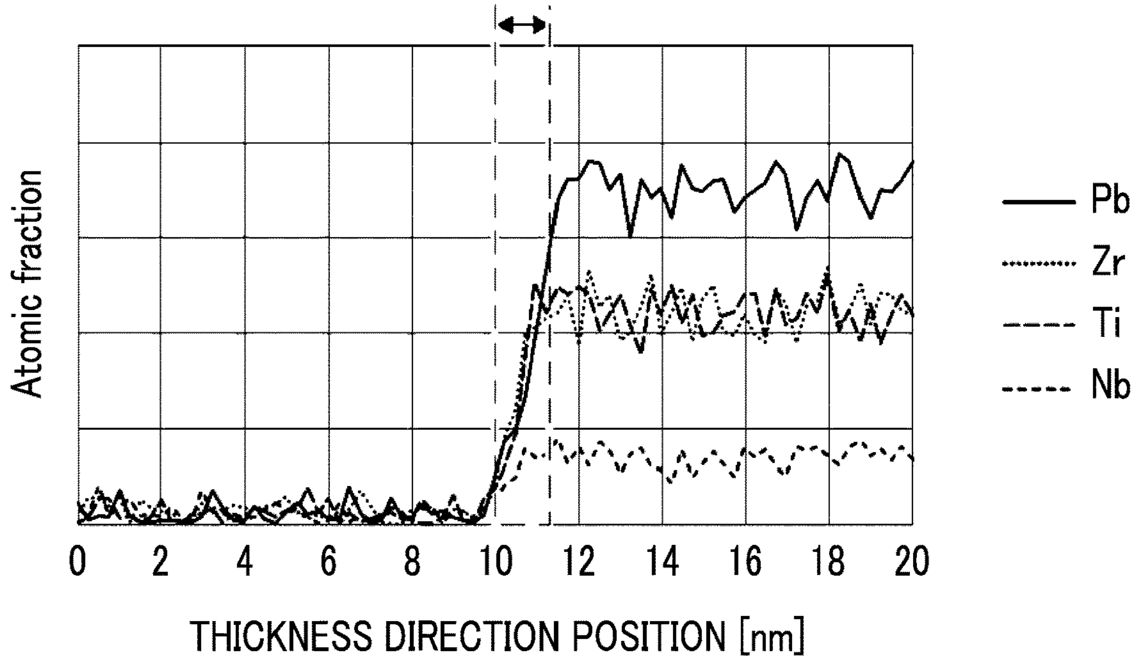
FIG. 5 is a graph showing an element content in the thickness direction of a laminate of Example 1 by EDS measurement.
Figure 6:
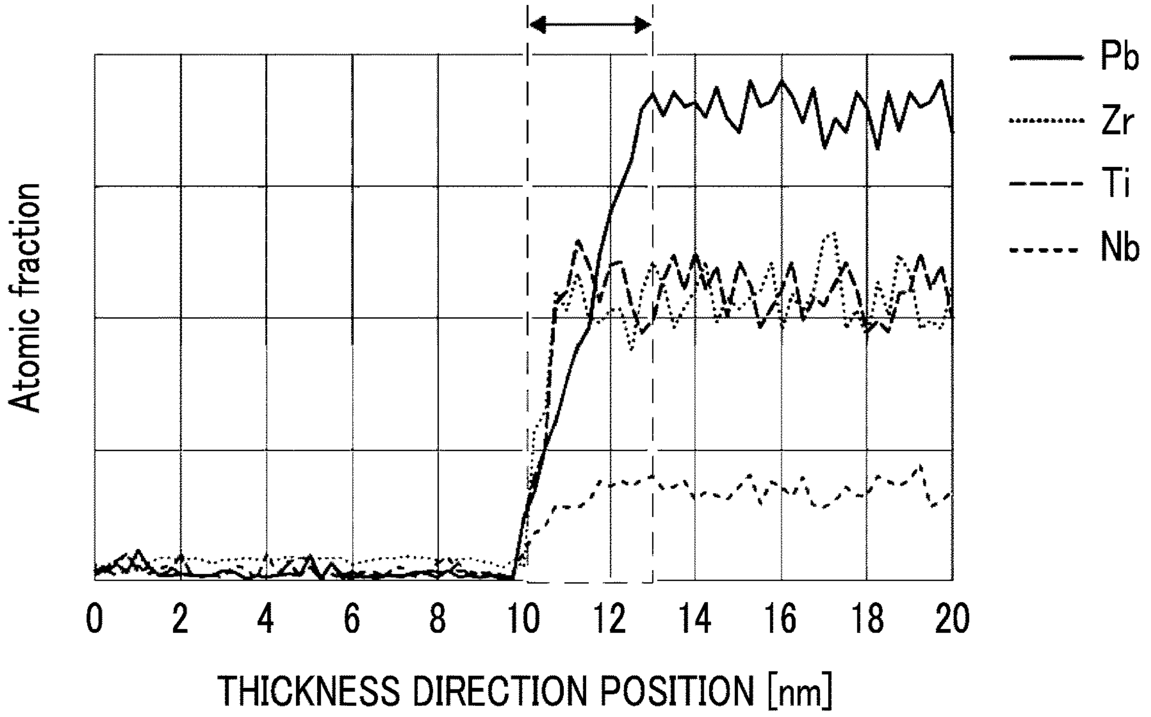
FIG. 6 is a graph showing an element content in the thickness direction of a laminate of Example 2 by EDS measurement.
Figure 7:
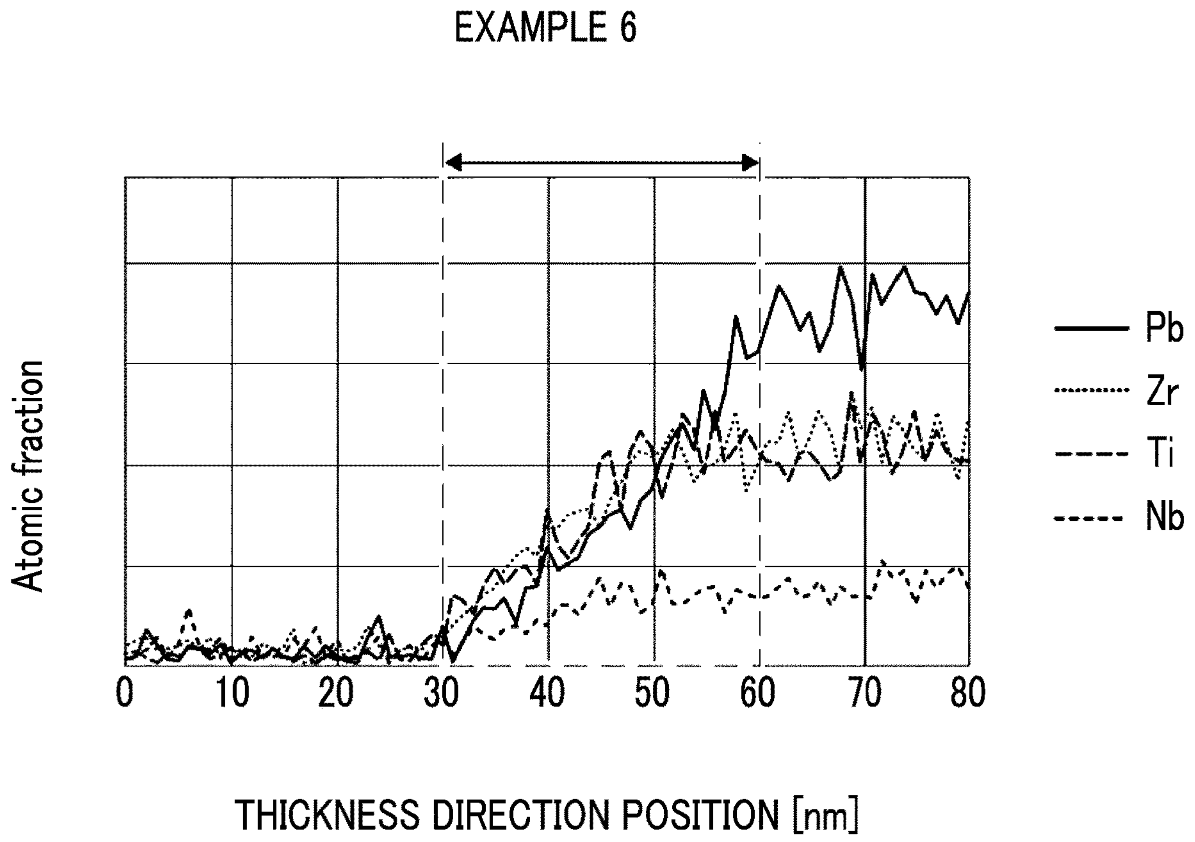
FIG. 7 is a graph showing an element content in the thickness direction of a laminate of Example 6 by EDS measurement.

On the other hand, in the region indicated by the double arrow in FIG. 5 to FIG. 7, the ratio of Pb:Zr:Ti:Nb is different from the ratio in the first region 26 (the region on the right side of the region indicated by the double arrow) of the piezoelectric film 25. The ratio of Pb (the Pb compositional ratio) in the region indicated by the double arrow is smaller than the Pb composition in the first region 26. In Examples 1, 2, and 6 shown in FIG. 5 to FIG. 7, the ratio of P:Zr:Ti:Nb in the first region 26 changes in a way distinctly different from the naturally formed interface region shown in FIG. 4, in which the ratio of Pb:Zr:Ti:Nb has hardly changed and the amount of each element has gradually decreased toward the upper electrode side. The region in which the Pb compositional ratio in Pb:Zr:Ti:Nb becomes small in this way is the second region 27.

In FIG. 5 and FIG. 6, a position on the lateral axis at substantially 10 nm is the outermost surface of the piezoelectric film 25, that is, an interface with the upper electrode layer 28. In FIG. 7, a position on the lateral axis at substantially 30 nm is the outermost surface of the piezoelectric film 25, that is, an interface with the upper electrode layer 28. In each example, the region sandwiched between the two broken lines is the second region 27, where the composition of the second region 27 changes in the film thickness direction, and it is estimated to be $\delta/3 \leq \alpha < \delta$ in that range. That is, in Examples 1, 2, and 6, a is smaller than the Pb compositional ratio δ of the first region 26 from the boundary with the first region 26, a gradually becomes smaller toward the surface, and monotonically decreases to about ⅓ of δ at the boundary with the upper electrode layer 28.

It is noted that since the same manufacturing method is used for Examples, a is monotonically decreased from the first region 26 side toward the upper electrode layer 28 side, as in the cases of Examples 1, 2, and 6.

<Measurement of Piezoelectric Constant>

The piezoelectric constant of the piezoelectric element of each example was measured by the following method.

The laminate produced as described above was cut into a strip shape of 2 mm×25 mm to prepare a cantilever, and according to the method described in I. Kanno et. al., Sensor and Actuator A 107 (2003) 68, the piezoelectric constant was measured using an applied voltage of a sine wave of −10 V±10 V, that is, a bias voltage of −10 V, and an applied voltage of a sine wave having an amplitude of 10 V. The piezoelectric constant d31 for the piezoelectric element of Comparative Example 1 having no second region is 200 pm/V, and with setting this value as 100%, the piezoelectric constants of Examples 1 to 10 and Comparative Example 2 are shown in Table 1.

<Measurement of Withstand Voltage>

Figure 8:
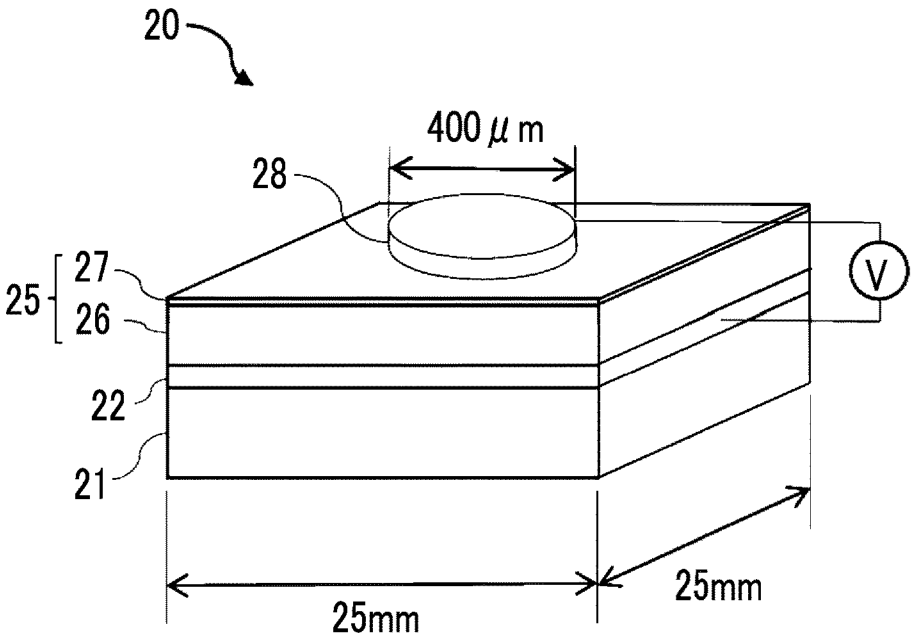
FIG. 8 is a view illustrating a schematic configuration of a piezoelectric element at the time of withstand voltage measurement.

The withstand voltage of the piezoelectric element was measured by the following method. FIG. 8 is a view illustrating a schematic configuration of a piezoelectric element 20 used for the withstand voltage measurement. The laminate prepared as described above was cut into a square shape of 25 mm×25 mm, and the upper electrode layer 28 was patterned in a circular shape having a diameter of 400 μm according to a lift-off method. The lower electrode layer 22 was grounded, and a negative potential was applied to the upper electrode layer 28. The potential applied to the upper electrode layer 28 was changed at −1 V/sec, and the voltage applied between the upper electrode layer 28 and the lower electrode layer 22 was gradually increased. At this time, a voltage at which a current of 1 mA or more flows between the upper electrode layer 28 and the lower electrode layer 22 was regarded as a dielectric breakdown voltage. A total of 10 measurements were carried out, and an average value (in terms of absolute value) therefrom was defined as a withstand voltage.

Table 1 below shows values of Examples 1 to 10 and Comparative Example 2 for the product of the piezoelectric constant and the withstand voltage obtained as described above in a case where the value of Comparative Example 1 is 100%. It is meant that the larger the product of the piezoelectric constant and the withstand voltage is, the more compatibility between the piezoelectric constant and the withstand voltage is achieved.

Table 1 below summarizes the configurations, upper electrode materials, and evaluation results of the PZT films of Examples 1 to 10 and Comparative Examples 1 and 2.

TABLE 1

| | PZT membrane | | | Evaluation | | |
|---|---|---|---|---|---|---|
| | First region | Second region | Upper electrode layer (100 nm thickness) | Piezoelectric constant [%] | Withstand voltage [V] | Piezoelectric constant × withstand voltage [%] |
| Example 1 | 2 | 1.5 | ITO | 98 | 138 | 113 |
| Example 2 | 2 | 3 | ITO | 97 | 146 | 118 |
| Example 3 | 2 | 5 | ITO | 95 | 154 | 122 |
| Example 4 | 2 | 10 | ITO | 85 | 168 | 119 |
| Example 5 | 2 | 20 | ITO | 79 | 178 | 117 |

TABLE 1-continued

| | PZT membrane | | | Evaluation | | |
|---|---|---|---|---|---|---|
| | First region | Second region | Upper electrode layer (100 nm thickness) | Piezoelectric constant [%] | Withstand voltage [V] | Piezoelectric constant × withstand voltage [%] |
| Example 6 | 2 | 30 | ITO | 68 | 180 | 102 |
| Example 7 | 2 | 5 | IrO | 97 | 138 | 112 |
| Example 8 | 2 | 5 | SRO | 94 | 144 | 113 |
| Example 9 | 2 | 5 | Ti/Au(20/80) | 75 | 168 | 105 |
| Example 10 | 2 | 5 | ITO/Ti/Au(40/20/40) | 95 | 140 | 111 |
| Comparative Example 1 | 2 | 0 | ITO | 100 | 120 | 100 |
| Comparative Example 2 | 2 | 5($Al_2O_3$) | ITO | 85 | 158 | 112 |

In a case where the second region 27 is not provided as in Comparative Example 1, the piezoelectric constant is largest; however, the withstand voltage is lowest. As shown in Table 1, in a case where the second region 27 is provided, the piezoelectric constant decreases; however, the withstand voltage is high as compared with Comparative Example 1. From Examples 1 to 10, it is revealed that the product of the piezoelectric constant and the withstand voltage, which indicates the degree of the compatibility between the piezoelectric constant and the withstand voltage, is larger than that of Comparative Example 1, and thus the withstand voltage can be improved while suppressing a decrease in the piezoelectric constant.

The configuration of Comparative Example 2 is such that the second region 27 is replaced with an $Al_2O_3$ film in the configuration of Example 3. In Example 3, although the withstand voltage is slightly low as compared with Comparative Example 2, the decrease in the piezoelectric constant is small, and thus the product of the piezoelectric constant and the withstand voltage is large as compared with Comparative Example 2, which indicates that the effect of achieving the compatibility between the piezoelectric constant and the withstand voltage is high. In addition, Comparative Example 2 is costly from the viewpoint that a material needs to be separately prepared in order to provide the $Al_2O_3$ film; however, in Example 3, the first region 26 and the second region 27 are capable of being produced from a common material, whereby a higher effect can be obtained at a low cost.

The disclosure of JP2020-166405 filed on Sep. 30, 2020, is incorporated in the present specification by reference in its entirety.

All documents, patent applications, and technical standards described in the present specification are incorporated herein by reference, to the same extent as in the case where each of the documents, patent applications, and technical standards is specifically and individually described.

What is claimed is:

1. A substrate with a piezoelectric film, comprising, on a substrate in the following order:

a lower electrode layer; and a piezoelectric film;

wherein in a case where B is denoted as a B site element in a perovskite-type structure, the piezoelectric film includes, a first region containing a perovskite-type oxide represented by General Formula (1), $$Pb_\delta BO_3 \quad (1)$$

$1 \leq \delta \leq 1.5$, and a second region consisting of the same elements as elements in the first region and containing an oxide represented by General Formula (2), $$Pb_\alpha BO_3 \quad (2)$$

$\delta/3 \leq \alpha < \delta$, and the second region is provided on an outermost layer of the piezoelectric film opposite to the lower electrode layer, and wherein in the second region, a compositional ratio α in General Formula (2) decreases monotonically from a first region side toward the outermost surface.

2. The substrate with a piezoelectric film according to claim 1, wherein in General Formula (1), $B=(Zr_xTi_{1-x})_{1-y}M_y$ is satisfied, where M is one or more elements selected from V, Nb, Ta, Sb, Mo, and W.

3. The substrate with a piezoelectric film according to claim 1, wherein a thickness of the second region is more than 1 nm.

4. The substrate with a piezoelectric film according to claim 1, wherein a thickness of the second region is 20 nm or less.

5. A piezoelectric element comprising:

the substrate with a piezoelectric film according to claim 1; and an upper electrode layer provided on the piezoelectric film.

6. The piezoelectric element according to claim 5, wherein at least a region of the upper electrode layer, the region being in contact with the piezoelectric film, is a conductive oxide.

7. The piezoelectric element according to claim 6, wherein the conductive oxide is ITO, Ir oxide, or SRO.

8. The substrate with a piezoelectric film according to claim 1, wherein in the second region, the compositional ratio α gradually becomes smaller from a boundary with the first region toward the outermost surface, and monotonically decreases to about ⅓ of δ at a boundary with the upper electrode layer.

* * * * *